United States Patent
Bernstein et al.

(10) Patent No.: US 9,052,724 B2
(45) Date of Patent: Jun. 9, 2015

(54) ELECTRO-RHEOLOGICAL MICRO-CHANNEL ANISOTROPIC COOLED INTEGRATED CIRCUITS AND METHODS THEREOF

(75) Inventors: Kerry Bernstein, Underhill, VT (US); Kenneth J. Goodnow, Essex Junction, VT (US); Clarence R. Ogilvie, Huntington, VT (US)

(73) Assignee: International Business Machines Corporation, Armonk, NY (US)

( * ) Notice: Subject to any disclaimer, the term of this patent is extended or adjusted under 35 U.S.C. 154(b) by 209 days.

(21) Appl. No.: 13/568,248

(22) Filed: Aug. 7, 2012

(65) Prior Publication Data

US 2014/0043757 A1 Feb. 13, 2014

(51) Int. Cl.

| | |
|---|---|
| H01L 23/34 | (2006.01) |
| G05D 23/00 | (2006.01) |
| G05D 23/19 | (2006.01) |
| H01L 23/38 | (2006.01) |
| H01L 23/473 | (2006.01) |
| H05K 7/20 | (2006.01) |
| G06F 1/20 | (2006.01) |

(52) U.S. Cl.
CPC ............ *G05D 23/1919* (2013.01); *G06F 1/206* (2013.01); *H05K 7/20518* (2013.01); *H05K 7/20281* (2013.01); *H05K 7/20272* (2013.01); *H01L 23/38* (2013.01); *H01L 23/473* (2013.01); *H01L 2224/16225* (2013.01); *H01L 2924/15174* (2013.01); *H01L 2924/15311* (2013.01); *H01L 2924/1305* (2013.01)

(58) Field of Classification Search
CPC ............... H05K 7/20–7/2099; G05D 23/1919; H01L 23/473; H01L 23/38; H01L 2924/1305; H01L 2924/15311; H01L 2224/16225; H01L 2924/15174; G06F 1/20–1/206
USPC ......... 361/679.46–679.54, 688–723; 700/300
See application file for complete search history.

(56) References Cited

U.S. PATENT DOCUMENTS

| | | | |
|---|---|---|---|
| 4,573,067 A | | 2/1986 | Tuckerman et al. |
| 4,812,251 A | * | 3/1989 | Stangroom ............... 252/75 |
| 4,923,057 A | * | 5/1990 | Carlson et al. ........... 188/378 |
| 5,987,196 A | * | 11/1999 | Noble ....................... 385/14 |
| 6,101,715 A | | 8/2000 | Fuesser et al. |
| 6,352,144 B1 | * | 3/2002 | Brooks .................. 188/267.2 |
| 6,934,154 B2 | | 8/2005 | Prasher et al. |
| 6,981,849 B2 | * | 1/2006 | Kim et al. ................. 417/50 |
| 6,992,382 B2 | | 1/2006 | Chrysler et al. |
| 7,277,284 B2 | | 10/2007 | Lee et al. |

(Continued)

FOREIGN PATENT DOCUMENTS

| | | |
|---|---|---|
| DE | 4224450 | 2/1994 |
| DE | 19725686 | 12/1998 |

(Continued)

*Primary Examiner* — Zachary M Pape
(74) *Attorney, Agent, or Firm* — Schmeiser, Olsen & Watts; David A. Cain

(57) ABSTRACT

An integrated circuit chip having micro-channels formed in multiple regions of the integrated circuit chip and a method of cooling the integrated circuit chip. The method includes for any region of the multiple regions, allowing a coolant to flow through micro-channels of the region only when a temperature of the region exceed a first specified temperature and blocking the coolant from flowing through the micro-channels of the region when a temperature of the region is below a second specified temperature.

21 Claims, 6 Drawing Sheets

(56) References Cited

U.S. PATENT DOCUMENTS

| | | | |
|---|---|---|---|
| 7,842,248 B2* | 11/2010 | McAvoy et al. | 422/505 |
| 7,891,865 B2* | 2/2011 | Clark et al. | 374/110 |
| 7,940,527 B2 | 5/2011 | Krause | |
| 7,975,723 B2 | 7/2011 | Peeters et al. | |
| 2004/0113265 A1* | 6/2004 | DiBattista et al. | 257/714 |
| 2006/0180300 A1* | 8/2006 | Lenehan et al. | 165/247 |
| 2011/0151198 A1* | 6/2011 | Washizu et al. | 428/172 |
| 2012/0140416 A1* | 6/2012 | Price et al. | 361/701 |

FOREIGN PATENT DOCUMENTS

| | | |
|---|---|---|
| EP | 1109087 | 12/1999 |
| JP | 8194545 | 7/1996 |
| JP | 9-53610 | 2/1997 |
| WO | 2011113181 | 9/2011 |

* cited by examiner

ELECTRO-RHEOLOGICAL MICRO-CHANNEL ANISOTROPIC COOLED INTEGRATED CIRCUITS AND METHODS THEREOF

FIELD OF THE INVENTION

The present invention relates to the field of integrated circuits; more specifically, it relates to methods for local temperature control of integrated circuits and locally temperature controlled electro-rheological micro-channel anisotropic cooled integrated circuits.

BACKGROUND

Timing variability in high performance logic chips is impacted in part by device junction temperature variations across the chip. These temperature differences induce changes in device transconductance which perturb circuit delays in cycle-limiting paths. Cooling techniques in present use only ensure that chip temperatures do not exceed levels that compromise reliability, but do not address the problem of local temperature variations due to differential device activity. Accordingly, there exists a need in the art to mitigate the deficiencies and limitations described hereinabove.

SUMMARY

A first aspect of the present invention is a method of cooling an integrated circuit chip having micro-channels formed in multiple regions of the integrated circuit chip, comprising: for any region of the multiple regions, allowing a coolant to flow through micro-channels of the region only when a temperature of the region exceed a first specified temperature and blocking the coolant from flowing through the micro-channels of the region when a temperature of the region is below a second specified temperature.

A second aspect of the present invention is a method of cooling an integrated circuit chip having micro-channels formed in multiple regions of the integrated circuit chip, comprising: (a) powering the integrated circuit chip; (b) measuring a temperature of a region of multiple regions of the integrated circuit chip; (c) if the temperature exceeds a first specified temperature, allowing a coolant to flow through the micro-channels in the region; (d) if the temperature is below a second specified temperature, blocking the coolant from flowing through the micro-channels in the region; and (e) repeating steps (b) through (d) as long as the integrated circuit chip is powered.

A third aspect of the present invention is a method of cooling an integrated circuit chip having micro-channels formed in multiple regions of the integrated circuit chip, comprising: (a) powering the integrated circuit chip; (b) measuring a first temperature of a first region of the multiple regions of the integrated circuit chip and a measuring a second temperature of a second region of the multiple region of the integrated circuit chip; (c) if the first temperature and the second temperature are not the same within a first range, then blocking coolant to flow through the micro-channels in the cooler of the first and second regions and allowing coolant to flow through the micro-channels in the cooler of the first and second regions; and (d) repeating steps (b) and (c) as long as the integrated circuit chip is powered.

A fourth aspect of the present invention is a structure, comprising: an integrated circuit chip having a frontside and a backside; micro-channels formed in a semiconductor layer proximate to a backside of the integrated circuit chip and functional circuits formed in a semiconductor layer of the integrated circuit chip proximate to a frontside of the integrated circuit chip, opposite ends of the micro-channels connected to first and second reservoirs in the semiconductor layer proximate to the backside of the integrated circuit chip; functional circuits formed in the semiconductor layer of the integrated circuit chip proximate to the frontside of the integrated circuit chip; a coolant filling the micro-channels and the first and second reservoirs; means for circulating the coolant from the first reservoir through the micro-channels to the second reservoir and from the second reservoir back to the first reservoir; and means for allowing the coolant to flow through micro-channels of regions of the integrated circuit only when temperatures of the regions exceed a first specified temperature and means for blocking the coolant from flowing through micro-channels of regions of the integrated circuit when a temperature of the region is below a second specified temperature.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION

Figure 1A:
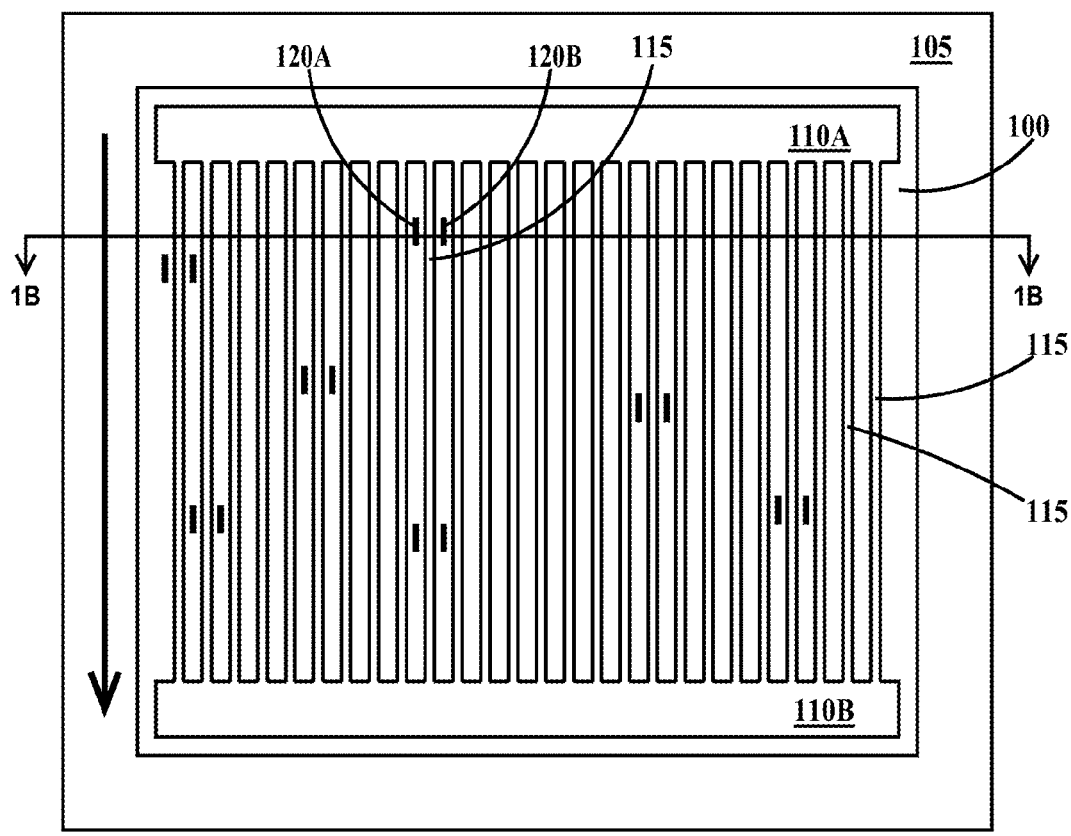
FIG. 1A is a top view and FIG. 1B is a cross-section view through line 1B-1B of FIG. 1A illustrating an exemplary micro-channel cooled integrated circuit according to embodiments of the present invention.

The embodiments of the present invention provide a plurality of micro-channels and electrodes formed in the backside of an integrated circuit chip for selective control of the flow of an electro-rheological (ER) cooling fluid through the micro-channels in regions of the integrated circuit chip.

An ER fluid comprises a suspension of extremely fine non-conducting particles (e.g., about 0.1 micron to about 5 micron) in an electrically insulating fluid. The apparent viscosity of an ER fluid changes reversibly by an order of up to 100,000 in response to an electric field. For example, a typical ER fluid can go from the consistency of a liquid (low viscosity) to that of a gel (high viscosity), and back, with response times on the order of milliseconds.

Application of an electric field across a micro-channel causes the ER fluid to change from a liquid state to a gel state, blocking the channel and stopping ER fluid flow through the channel. With no electric field applied, the ER fluid is in the liquid state and free to flow and thus cool the region of the chip proximate to the micro-channel. An ER fluid comprises particles mixed with a suspension liquid and may also include surfactants and additives.

Examples of particle materials that may be used in an ER fluid include, but are not limited to: alpha-silica, maleic anhydride, alginic acid, mannitol, alumina, metallic semiconductors, alumina silica mixtures, methoxyphenylimidoperylene, aluminum oleate, methyl acrylate, aluminum octoate, methyl methacrylate, aluminum stearate, microcel-C, azaporhin systems, microcrystalline cellulose, barium titanate, micronized mica, boron, monosaccharides, cadmiumsulphidephosphor, calcium stearate N-vinylpyrrolidole, carbon, cellulose, olefins, ceramics, phenolformaldehyde polymers, chloride phthalocyanine, colloidal kaolin clay, polystyrene polymers, colloidal silica, porhin, crystalline D-sorbitol, phosphototungstomolybic acid, diallylether, polymethacrylate mixtures, dimethyl hydrontoin resin, polyvinyl alcohols, diethylcarbocyanineiodide, pyrogenic silica, diphenylthiazoleanthraquinone, quartz, divinylbenzene, substituted quinacridone, flavanthrone, silica aerogel, silica gel, silica xerogel, glass, silicone ionomers, copper phthalocyanine, sorbitol, gypsum, Teflon, lauryl pyridinium, lead oxide, water-saturated silica, white bentonite, lithium polymethacrylate, zinc oxide, lithium stearate, zinc sulphidephosphor, magnesium silicate, zinc stearate, and maleic acid.

Examples of suspension liquids that may be used in an ER fluid include, but are not limited to: aldehydes, aliphatic esters, ketones, carbon tetrachloride, liquid paraffin, chlorobentzenediphenyl alkanes, mineral oil, chloroform, olefins, di-2-ethylhexyl adipate, dibutyl sebacate, orthochlorotoluene, polyalkylene glycols, ethers, polychlorinated biphenyls, diphenyl ethers, polychlorotrifluoroethylene, diphenyl sulphoxides, diphenyl sulphones, silicone oils, fluorinated hydrocarbons, fluorinated polymers, trifluorovinyl chloride, fluorosilicones and xylene.

Examples of surfactants that may be added to ER fluids include, but are not limited to: block copolymers, glyserol mono-oleates, borax, hydrocarbon polymers, dodecyl alcohol, lead napthenate, metal hydrates, octyl alcohol, glycerol, sodium oleate, glyserol esters and tin oxide.

Examples of additives that may be added to ER fluids include, but are not limited to: acetates, lactic acid, acetic acid, LiCl, alcohols, malic acid, aliphatic compounds, malonic acid, amines, metal chlorides, ammonium ion, monoethyl ether, butylamine, morpholine, calcium hydroxide, NaCl, diethylene glycol, NaOH, fluorides, octanoic acid, formic acid, oxalic acid, glycerine, pyruvic acid, hexylamine, trichloroasetic acid, KCl, water and KOH.

Just because that a given mixture contains the materials listed supra, does not mean that that mixture will exhibit electro-rheological activity (a change in viscosity in repose to an electric filed) as particle size, weight percentage of particle, particle size and the types and amounts of surfactants and additives will affect such activity. Electro-rheological fluids must be shown to exhibit electro-rheological activity.

Figure 1B:
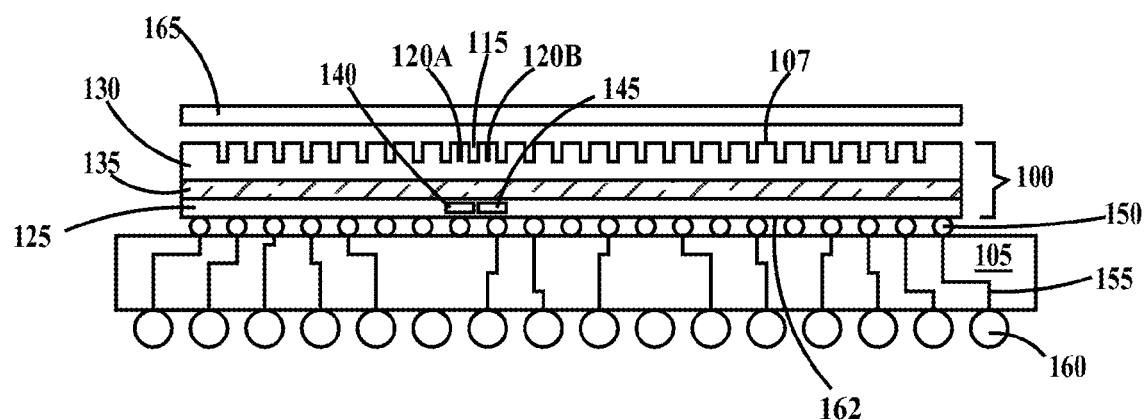

FIG. 1A is a top view and FIG. 1B is a cross-section view through line 1B-1B of FIG. 1A illustrating an exemplary micro-channel cooled integrated circuit according to embodiments of the present invention. In FIG. 1A, an integrated circuit chip 100 mounted on a module (or carrier) 160. Formed in the backside 107 of chip 100 are first ER fluid reservoir 110A connected to a second ER fluid reservoir 110B by a plurality of micro-channels 115. ER fluid reservoir 110A and 110B and micro-channels 115 are integrally formed (e.g., etched) in the backside of chip 100. Pairs of electrodes 120A and 120B are formed on opposite sides of micro-channels 115 in selected locations. In FIG. 2B, chip 100 comprises a semiconductor layer 125 separated from a supporting substrate 130 by a buried oxide (BOX) layer 135. In one example, semiconductor layer 125 is single crystal silicon. In one example, supporting substrate 130 is single crystal silicon. Formed in semiconductor layer 125 are a temperature sensing circuit 140 and a functional circuit (e.g., logic or memory circuit) 145. Temperature sensing circuit 140 monitors the local temperature of circuit 145 and controls a voltage differential applied to a corresponding pair of electrodes 120A and 120B to (i.e., those electrodes that control the flow of cooled ER fluid in adjacent to functional circuit 145) as described infra. Chip 100 is physically mounted to and electrically connected to carrier 105 by solder bumps 150. Wires 155 in carrier 105 connected to balls 160 on a bottom side 162 of carrier 105. A generic lid 165 is illustrated in FIG. 1B. Lid 165 provides a hermetic seal so as to contain an ER fluid in reservoirs 110A and 110B and micro-channels 115. The arrow on the left indicates the direction of flow through micro-channels 115. In one example, carrier 105 is a multi-layer ceramic module. In one example, carrier 105 is a multi-layer printed circuit board (PCB).

In FIG. 1B, chip 100 is formed a semiconductor-on-insulator (SOI) substrate. In order to obtain good thermal transfer, the distance between the micro-channels and the devices of circuit 145 (e.g., field effect and/or bipolar transistors) in semiconductor layer should be a small as possible. In one example, the thickness of semiconductor layer 125 is between about 2 microns and about 7 microns. In one example, the thickness of BOX layer 135 is between about 0.1 microns and about 0.5 microns. In one example, the thickness of supporting substrate 130 is between about 500 microns and about 750 microns. Alternatively, chip 100 may be formed on a bulk silicon substrate (no buried oxide layer) having a thickness between about 600 microns and about 800 microns.

Figure 2A:
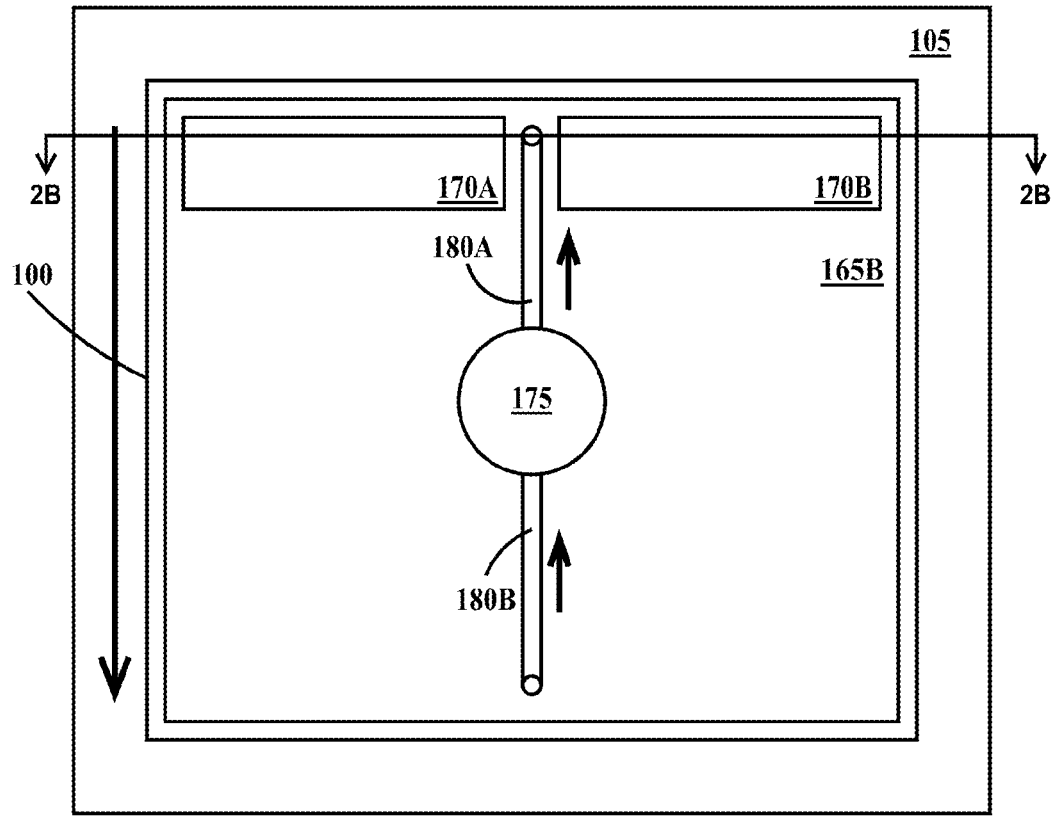
FIG. 2A is a top view and FIG. 2B is a cross-section view through line 2B-2B of FIG. 2A illustrating an exemplary micro-channel cooled integrated circuit using a Peltier device according to embodiments of the present invention.
Figure 2B:
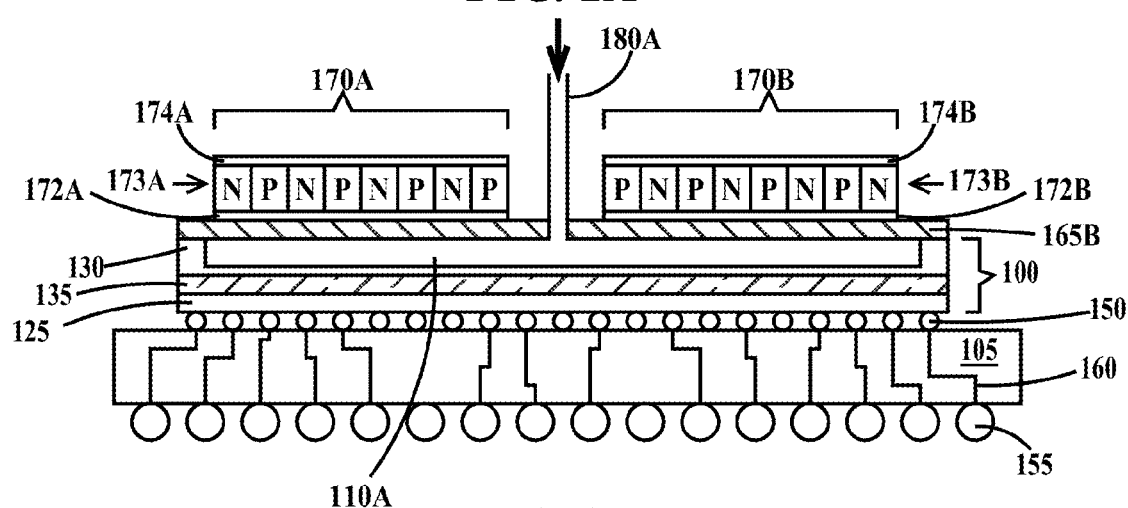

FIG. 2A is a top view and FIG. 2B is a cross-section view through line 2B-2B of FIG. 2A illustrating an exemplary micro-channel cooled integrated circuit using a Peltier device according to embodiments of the present invention. Line 2B-2B passes through first reservoir 110A. In FIGS. 2A and 2B, lid 165 of FIG. 1B has been replaced with a heat conductive lid (e.g., metal) 165B. A pair of Peltier devices 170B and 170B have been mounted on lid 165A over first reservoir 110A. Peltier device 170A includes a cooling plate 172A in contact with lid 165B, a heat dissipating plate 174A and an alternating N-doped/P-doped N semiconductor layer 173A between plates 172A and 1743A. Likewise Peltier device 170B includes a cooling plate 172B in contact with lid 165B, a heat dissipating plate 174B and an alternating P-doped N-doped semiconductor layer 173B between plates 172B and 174B. A pump 175 is mounted to lid 165B and pumps ER cooling fluid from second reservoir 110B (see, for example, FIG. 1A) through pipe 180B to first reservoir 110B through pipe 180A. In one example, power for Peltier devices 170A and 170B and pump 175 is supplied externally, through circuits in chip 100 may be used to turn the Peltier devices and pump on and off. In one example, for Peltier devices 170A and 170B and pump are wired to carrier 105.

Figure 3A:
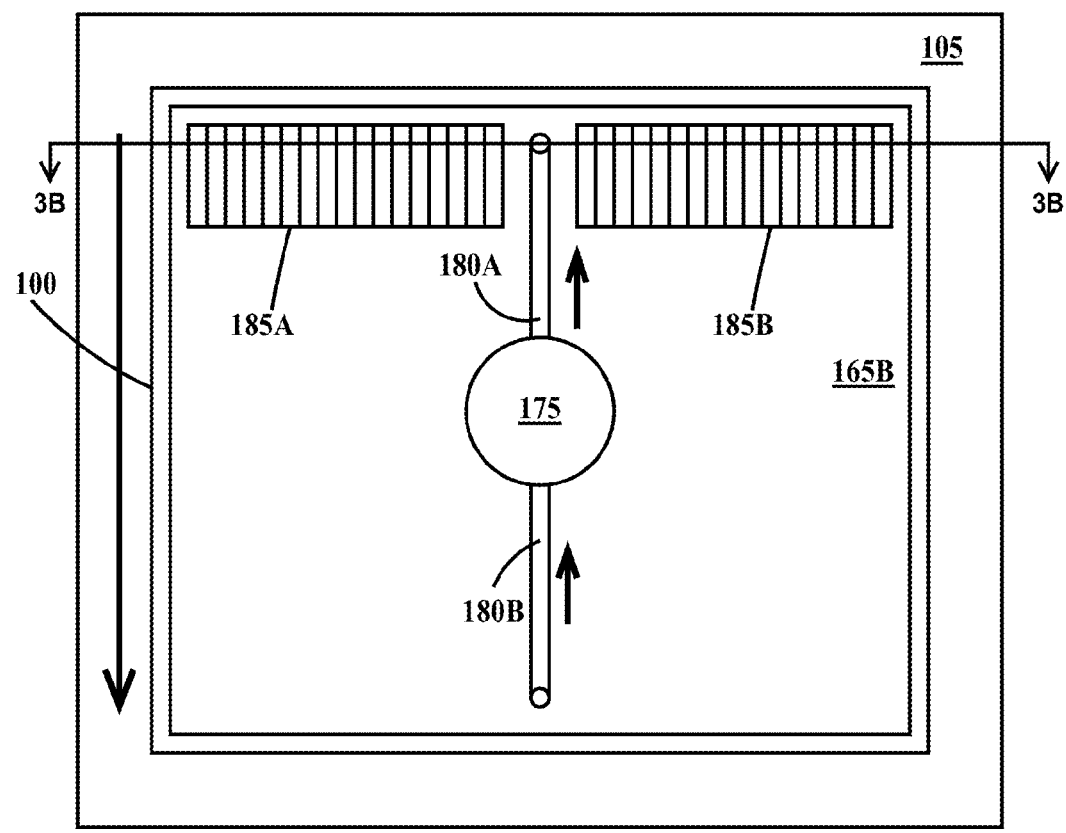
FIG. 3A is a top view and FIG. 3B is a cross-section view through line 3B-3B of FIG. 3A illustrating an exemplary micro-channel cooled integrated circuit using a heat sink according to embodiments of the present invention.
Figure 3B:
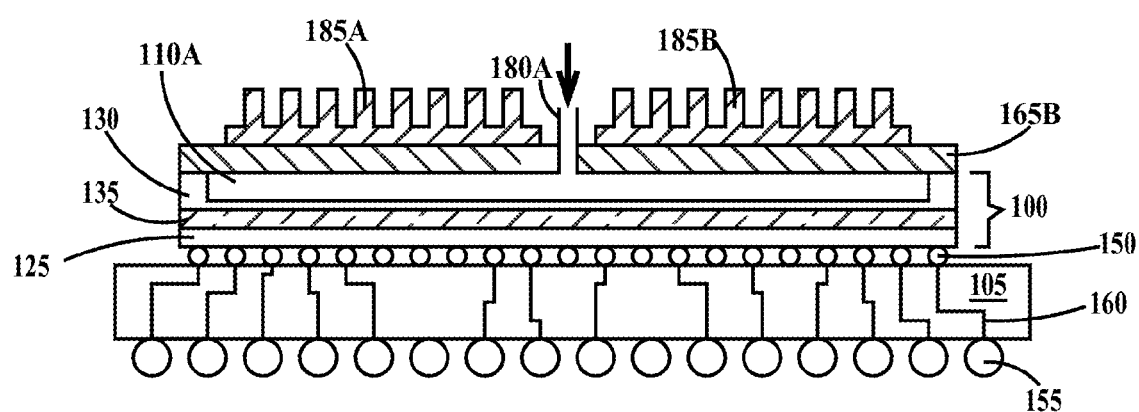

FIG. 3A is a top view and FIG. 3B is a cross-section view through line 3B-3B of FIG. 3A illustrating an exemplary micro-channel cooled integrated circuit using a heat sink according to embodiments of the present invention. FIGS. 3A and 3B are similar to FIGS. 2A and 2B respectively, except Peltier devices 170A and 170B of FIGS. 2A and 2B are replaced with heat sinks 185A and 185B respectively.

Figure 4:
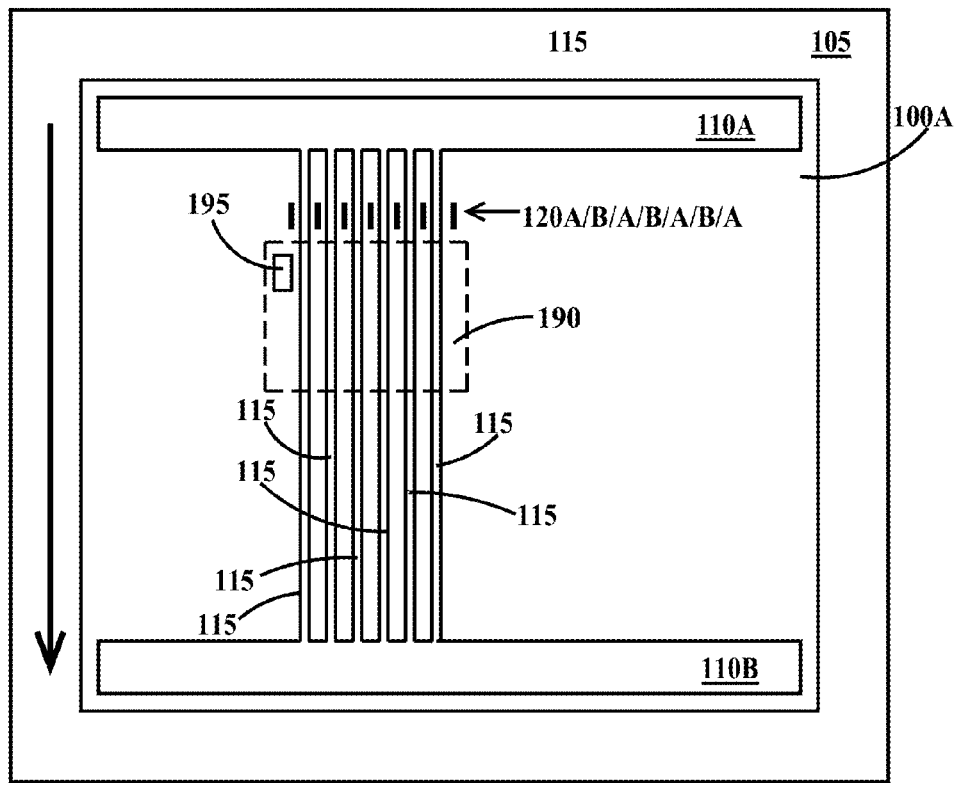
FIG. 4 is a top view of an exemplary micro-channel cooled integrated circuit according to embodiments of the present invention.

FIG. 4 is a top view of an exemplary micro-channel cooled integrated circuit according to embodiments of the present invention. For clarity, no lid or cooling devices are shown in FIG. 4. FIG. 4 gives an example, wherein micro-channels 115 are formed only in certain regions of the chip that need cooling. In FIG. 4, an integrated circuit chip 100A includes a functional circuit (or region of chip 100) 190 and a temperature sensor circuit 195. There are multiple micro-channels 115 passing over functional circuit 190. Multiple electrodes 120A and 120B alternate between micro-channels 115. All the electrodes 120A are wired together and all the electrodes 120B are wired together so an electric field can be generated across all the micro-channels 115 simultaneously when a voltage differential is applied between electrodes 120A and 120B to shut off ER coolant fluid flow. While one set of circuit 190, temperature sensor 195 and corresponding micro-channels 115 and electrodes 120A/B are illustrated, there may be multiple independent such sets.

Figures 5A, 5B, 6:
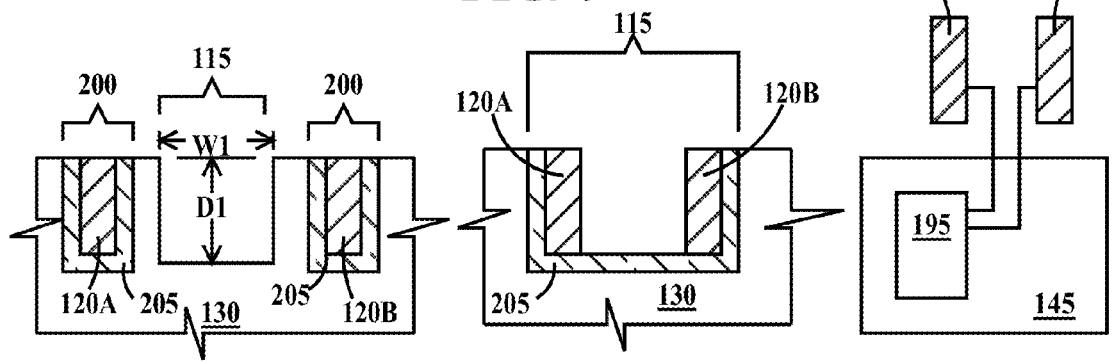
FIGS. 5A and 5B are a cross-section through a micro-channel according to embodiments of the present invention.
FIG. 6 is a circuit diagram for controlling the flow of electro-rheological fluid through the micro-channels of FIG. 4 according to embodiments of the present invention.

FIGS. 5A and 5B are a cross-section through a micro-channel according to embodiments of the present invention. In FIG. 5A, micro-channel 115 is a trench in supporting substrate 130 having a width W1 and a length D1. In one example, W1 is between about 1 micron and about 10 microns. In one example, D1 is between about 1 micron and about 10 microns. In one example, the width and depth of micro-channel 115 are at least 5 times the ER fluid particle size. If the width of the micro-channels becomes too large (e.g., exceeds about 50 microns), then the local temperature controlled regions become to large to reduce the otherwise large temperature gradients produced by circuits of the chip turning on and off without affecting the performance of those circuits. Electrodes 120A/B are formed in trenches 200 in supporting substrate 130. Trenches 200 have a dielectric liner to prevent cross-talk between different electrodes 120A/B. In FIG. 5B, electrodes 120A/B are formed within micro-channels 115 but isolated from supporting substrate 130 by dielectric liner 205.

FIG. 6 is a circuit diagram for controlling the flow of ER fluid through the micro-channels of FIG. 4 according to embodiments of the present invention. In FIG. 6, temperature sensor circuit 195 is directly connected to electrodes 120A and 120B. When the temperature sensor reads a temperature under over a preset $T_{max}$, the temperature sensor circuit applies a zero differential voltage between electrodes 120A and 120B generating an electric field that leaves the ER fluid liquid and allows coolant flow. When the temperature sensor reads under $T_{max}$, then the temperature sensor circuit applies a non-zero differential voltage between electrodes 120A and 120B generating an electric field that gels the ER fluid and stops coolant flow. In one example, $T_{max}$ is about 85° C. In one example, a zero voltage differential is generated by applying ground (0 volts) to both electrodes. In one example, a zero voltage differential is generated by applying the same positive or same negative voltage to both electrodes. In one example, a non-zero voltage differential is generated by applying ground (0 volts) to one electrode and a positive or negative voltage to the other electrode. In one example, a non-zero voltage differential is generated by applying different voltages to each of the electrodes. In one example, the voltage differential applied across electrode pairs 120A/120B is between about 1 volt and about 10 volts.

Figure 7:
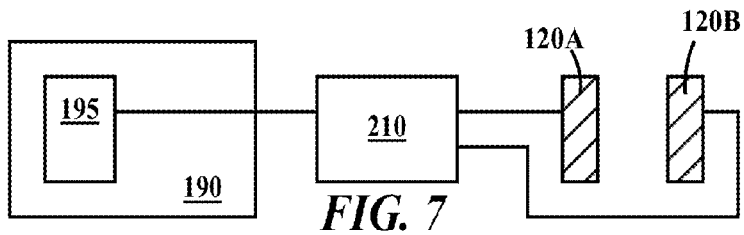
FIG. 7 is an alternate circuit diagram for controlling the flow of electro-rheological fluid through the micro-channels of FIG. 4 according to embodiments of the present invention.

FIG. 7 is an alternate circuit diagram for controlling the flow of ER fluid through the micro-channels of FIG. 4 according to embodiments of the present invention. In FIG. 7, temperature sensor circuit 195 only provides a control line to a control circuit 210 which is connected to electrodes 120A and 120B. This allows a differential voltage to be applied to the electrodes that may be greater than the temperature sensor or the functional circuit can provide.

Figure 8:
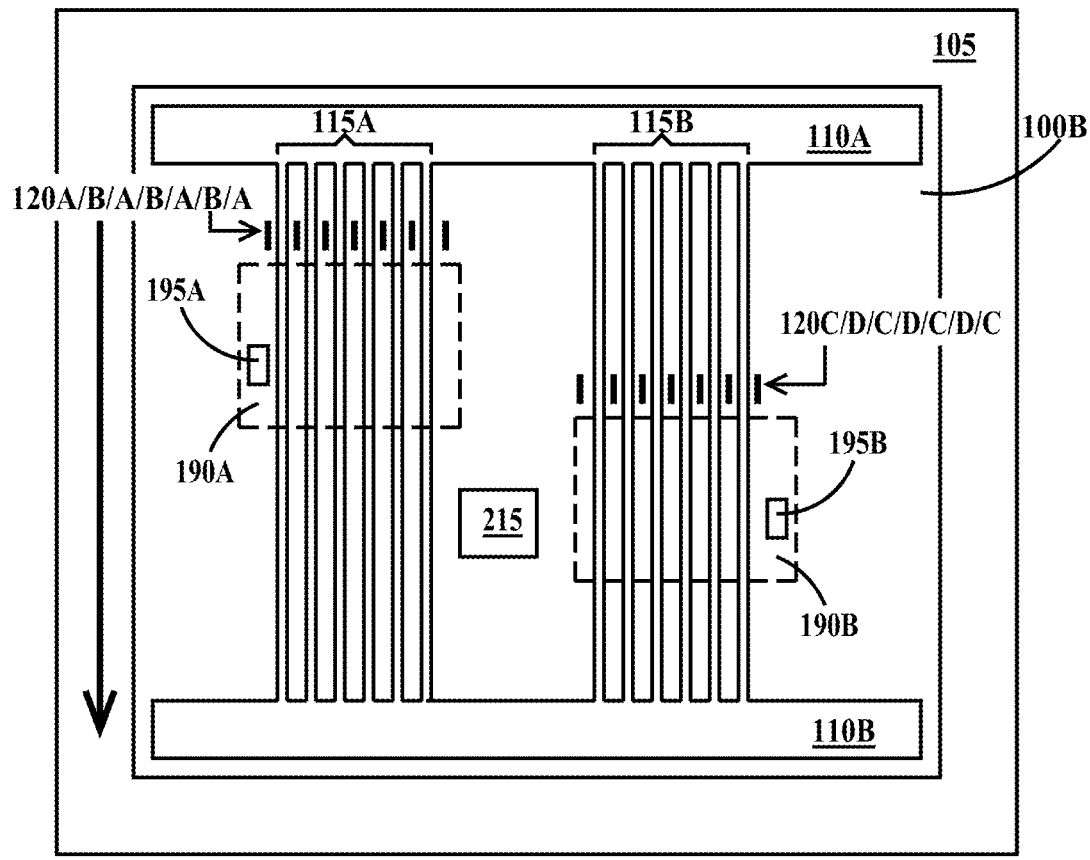
FIG. 8 is a top view of an exemplary micro-channel cooled integrated circuit according to an embodiment of the present invention.

FIG. 8 is a top view of an exemplary micro-channel cooled integrated circuit according to an embodiment of the present invention. FIG. 8 gives an example, wherein micro-channels 115 are formed under a pair of circuits that are to be kept at the same temperature. In FIG. 8, an integrated circuit chip 100B includes a first functional circuit 190A (or first region of chip 100) and a first temperature sensor circuit 195A. There are multiple micro-channels 115A passing over functional circuit 190A. Multiple electrodes 120A and 120B alternate between micro-channels 115A. All the electrodes 120A are wired together and all the electrodes 120B are wired together so an electric field can be generated across all the micro-channels 115A simultaneously when a voltage differential is applied to the electrodes to shut off ER coolant fluid flow over functional circuit 190A. Also, in FIG. 8, integrated circuit chip 100B includes a second functional circuit 190B (or second region of chip 100B) and a second temperature sensor circuit 195B. There are multiple micro-channels 115B passing over functional circuit 190B. Multiple electrodes 120C and 120D alternate between micro-channels 115B. All the electrodes 120C are wired together and all the electrodes 120D are wired together so an electric field can be generated across all the micro-channels 115B simultaneously when a voltage differential is applied to the electrodes to shut off ER coolant fluid flow over functional circuit 190B. Chip 100B also includes a control circuit 215.

Figure 9:
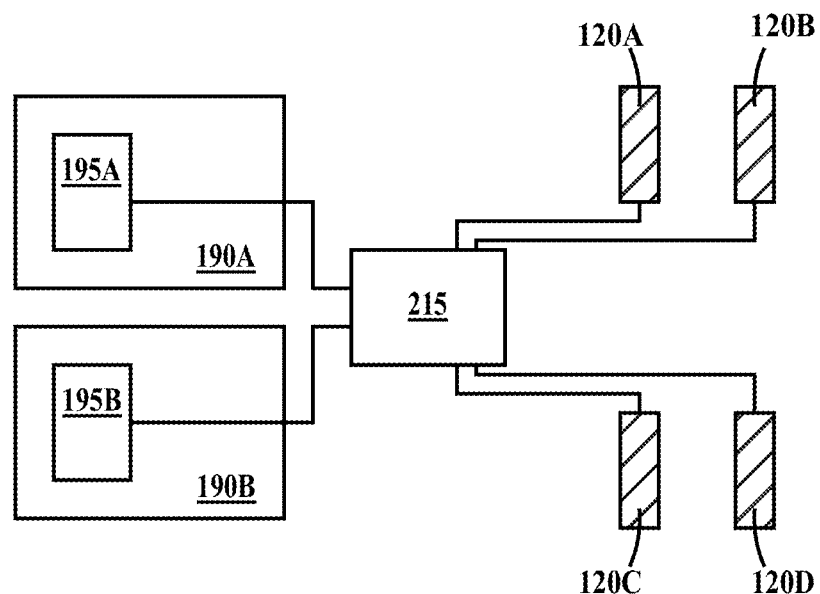
FIG. 9 is a circuit diagram of a circuit for controlling the flow of electro-rheological fluid through the micro-channels of FIG. 8 according to an embodiment of the present invention.

FIG. 9 is a circuit diagram of a circuit for controlling the flow of ER fluid through the micro-channels of FIG. 8 according to an embodiment of the present invention. In FIG. 9, temperature sensor circuits 195A and 195B only provide control lines to control circuit 215 which is connected to electrodes 120A, 120B, 120C and 120D. Based on the temperatures sensed by temperature sensor circuits 195A and 195B, controller 215 can apply: (1) a non-zero voltage differential across electrodes 120A and 120B and a zero-voltage differential across electrodes 120C and 120D, (2) a zero voltage differential across electrodes 120A and 120B and a non-zero voltage differential across electrodes 120C and 120D (3) a non-zero voltage differential across electrodes 120A and 120B and across electrodes 120C and 120D, and (4) a zero voltage differential across electrodes 120A and 120B and cross electrodes 120C and 120D. See description of FIG. 11 infra.

The connections between temperature sensors, control circuits and electrodes described supra with reference to FIGS. 6, 7 and 9 may be made (i) by conductive vias extending from the temperature sensor/control circuit through the chip or (ii) by connections made through the carrier (e.g., carrier 105 of FIG. 1B, 2B, 3B) to the lid (e.g., 165 of FIG. 1B, 165B of FIGS. 2A and 3A) than then to the electrodes (120A/120B of FIG. 4 or 120A/120B/120C/120D of FIG. 8).

Figure 10:
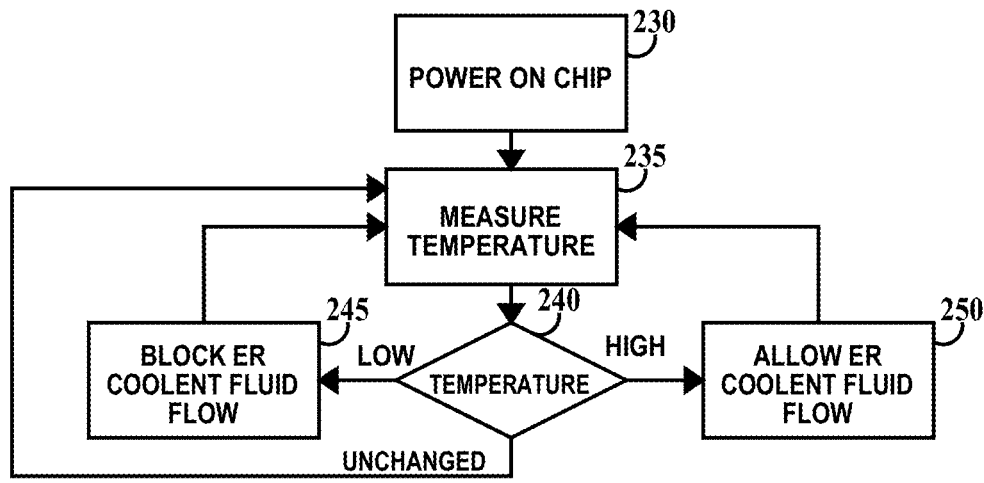
FIG. 10 is a flowchart of a method for independent temperature control of a region of an integrated circuit according to an embodiment of the present invention.

FIG. 10 is a flowchart of a method for independent temperature control of a region of an integrated circuit according to an embodiment of the present invention. In step 230, the integrated circuit chip is powered up and in step 235 the temperature of a region of the integrated circuit is measured. Next, in step 240, if the measured temperature is less than a specified $T_{max}$ then, in step 245, ER coolant fluid flow is blocked by applying an electric field across the micro-channels in the region (if an electric filed is not already applied) and the method loops back to step 230. If, in step 240, the measured temperature is greater than the specified $T_{max}$ then, in step 250, ER coolant fluid flow is allowed by removing any electric field already applied or by continuing to not apply an electric field across the micro-channels in the region and the method loops back to step 235. If in step 240, the measured temperature is unchanged from the previous measurement, the method loops back to step 235. The temperature measurement of step 235 may be done on a periodic basis. The high/low temperature decision of step 240 may be guard banded about a specified $T_{max}$. For example, a high reading set point may be $T_{max}$+X ° C. and a low reading set point may be $T_{max}$−Y ° C. A reading between $T_{max}$+X ° C. and $T_{max}$−Y ° C. is considered unchanged. X and Y are positive numbers. In one example, X and Y are independently between about 0.5° C. and about 10° C.

Figure 11:
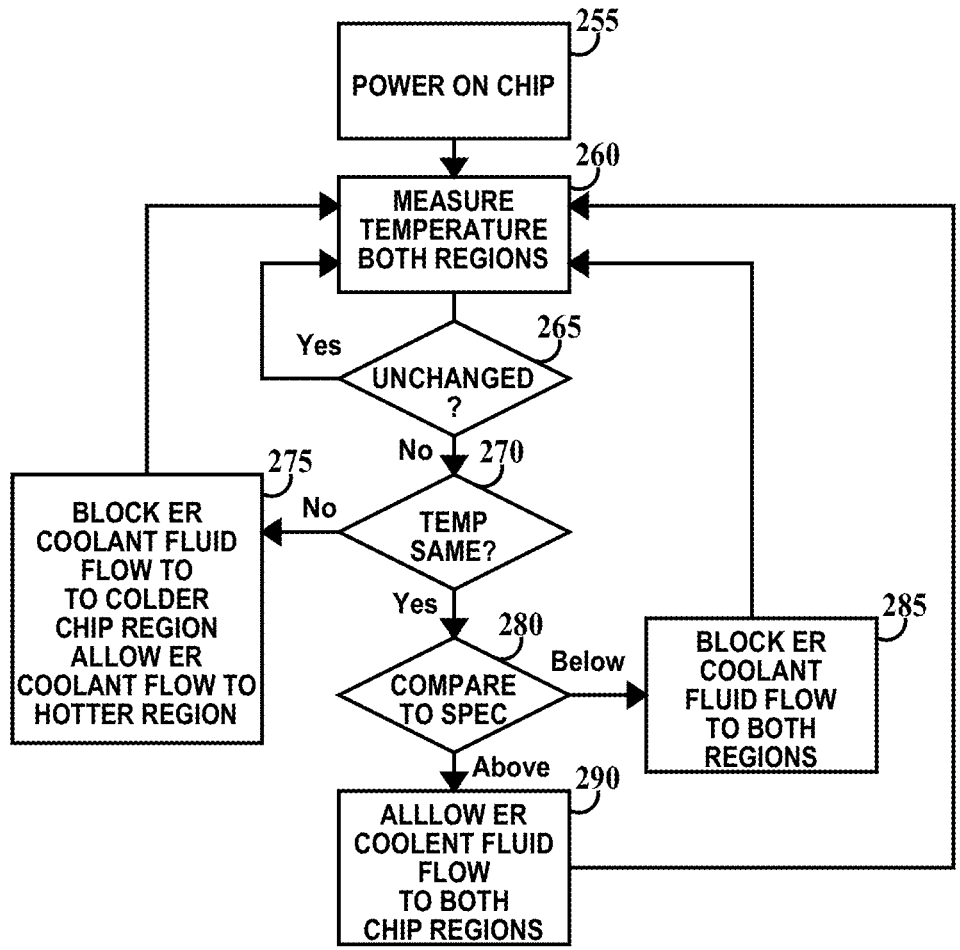
FIG. 11 is a flowchart of a method for differential temperature control of a region of an integrated circuit according to an embodiment of the present invention.

FIG. 11 is a flowchart of a method for differential temperature control of a region of an integrated circuit according to an embodiment of the present invention. In step 255, the integrated circuit chip is powered up and in step 260 the temperature of a first and second region of the integrated circuit is measured. The temperature measurements of step 260 may be done on a periodic basis. If in step 265, if both of the measured temperatures are unchanged (optionally within a preset limit of ±W ° C.) from the previous measurements, the method loops back to step 260. If, in step 260, the measured temperatures have changed the method proceeds to step 270. In step 270 it is determined if the two temperatures are the same (optionally within a preset limit of ±Z ° C.). If the two measured temperatures are the not the same then the method proceeds to step 275. In step 275, (1) ER coolant fluid flow is blocked to the colder region by applying an electric field across the micro-channels in the region (if an electric filed is not already applied); (2) ER coolant fluid flow is allowed by removing any electric field already applied or by continuing not to apply an electric field across the micro-channels in the hotter region; and (3) the method loops back to step 260. W and Z are positive numbers. In one example, W and Z are independently between about 0.5° C. and about 10° C.

If, in step 270, the measured temperature are not the same (again optionally within a preset limit of ±Y ° C.) the method proceeds to step 280. Next, in step 280, if the measured temperatures are less than a specified $T_{max}$ then, in step 285, ER coolant fluid flow in both regions is blocked by applying an electric field across the micro-channels in the regions (if an electric filed is not already applied) and the method loops back to step 260. If, in step 280, the measured temperature is greater than the specified $T_{max}$ then, in step 290, ER coolant fluid flow is allowed by removing any electric field already applied or by not applying an electric field across the micro-channels in the regions and the method loops back to step 260. The above/below temperature decision of step 280 may be guard banded about $T_{max}$. For example, a high reading set point may be $T_{max}$+X ° C. and a low reading set point may be Tmax −Y ° C. A reading between $T_{max}$+X ° C. and Tmax −Y ° C. is considered unchanged.

Alternatively, steps 280, 285 and 290 may be eliminated and the "YES" branch of step 280 loops back to step 260.

Thus, the embodiments of the present invention provide methods for local temperature control of integrated circuits and locally temperature controlled electro-rheological micro-channel anisotropic cooled integrated circuits.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of cooling an integrated circuit chip having micro-channels formed in multiple regions of said integrated circuit chip, comprising:
    for any region of said multiple regions, allowing a coolant to flow through micro-channels of said region only when a temperature of said region exceed a first specified temperature and blocking said coolant from flowing through said micro-channels of said region when a temperature of said region is below a second specified temperature; and
    wherein said blocking said coolant from flowing includes applying an electrical field across said micro-channels in said region.

2. The method of claim 1, wherein said coolant is an electro-rheological fluid.

3. The method of claim 1, and wherein said allowing said coolant to flow includes (i) not applying an electric field across said micro-channels in said region or (ii) removing an electric field previously applied across said micro-channels in said region.

4. The method of claim 1, wherein said micro-channels are formed in a supporting substrate proximate to a backside of said integrated circuit chip and functional circuits are formed in a semiconductor layer of said integrated circuit chip proximate to a frontside of said integrated circuit chip.

5. A method of cooling an integrated circuit chip having micro-channels formed in multiple regions of said integrated circuit chip, comprising:
    (a) powering said integrated circuit chip;
    (b) measuring a temperature of a region of multiple regions of said integrated circuit chip;
    (c) if said temperature exceeds a first specified temperature, allowing a coolant to flow through said micro-channels in said region;
    (d) if said temperature is below a second specified temperature, blocking said coolant from flowing through said micro-channels in said region by applying an electrical field across said micro-channels in said region to increase the viscosity of said coolant above a viscosity of said coolant in the absence of an electrical field; and
    (e) repeating steps (b) through (d) as long as said integrated circuit chip is powered.

6. The method of claim 5, wherein said coolant is an electro-rheological fluid having a lower viscosity in the absence of an electric field and a higher viscosity in the presence of an electric field.

7. The method of claim 5, wherein said allowing said coolant to flow includes (i) not applying an electric field across said micro-channels in said region or (ii) removing an electric field previously applied across said micro-channels in said region so said coolant has a lower viscosity than a viscosity of said coolant in the presence of an electric field.

8. The method of claim 5, wherein said micro-channels are formed in a supporting substrate proximate to a backside of said integrated circuit chip and functional circuits are formed in a semiconductor layer of said integrated circuit chip proximate to a frontside of said integrated circuit chip.

9. The method of claim 8, wherein opposite ends of said micro-channels are connected to first and second reservoirs in said supporting substrate proximate to said backside of said integrated circuit chip and said coolant is circulated from said first reservoir, through unblocked micro-channels to said second reservoir and back to said first reservoir, said fluid being cooled during said circulation.

10. A method of cooling an integrated circuit chip having micro-channels formed in multiple regions of said integrated circuit chip, comprising:
(a) powering said integrated circuit chip;
(b) measuring a first temperature of a first region of said multiple regions of said integrated circuit chip and measuring a second temperature of a second region of said multiple region of said integrated circuit chip;
(c) if said first temperature and said second temperature are not the same within a first range, then blocking coolant to flow through said micro-channels in the cooler of said first and second regions by applying an electrical field across said micro-channels in said cooler of said first and second regions to increase the viscosity of said coolant above a viscosity of said coolant in the absence of an electrical field and allowing coolant to flow through said micro-channels in the warmer of said first and second regions; and
(d) repeating steps (b) and (c) as long as said integrated circuit chip is powered.

11. The method of claim 10, further including between (c) and (d):
(i) if said first temperature and said second temperature are the same within said first range and said first temperature and said second temperature are above a second range about a preset maximum temperature, then allowing coolant to flow through said micro-channels in both said first and second regions; or
(ii) if said first temperature and said second temperature are the same within said first range and said first temperature and said second temperature are below a second range about said preset maximum temperature, then blocking coolant from flowing through said micro-channels in both said first and second regions.

12. The method of claim 10, wherein said coolant is an electro-rheological fluid having a lower viscosity in the absence of an electric field and a higher viscosity in the presence of an electric field.

13. The method of claim 10, wherein said allowing said coolant flow includes (i) not applying an electric field across said micro-channels in said region or (ii) removing an electric field previously applied across said micro-channels in said region so (iii) said coolant has a lower viscosity than a viscosity of said coolant in the presence of an electric field.

14. The method of claim 10, wherein said micro-channels are formed in a supporting substrate proximate to a backside of said integrated circuit chip and functional circuits are formed in a semiconductor layer of said integrated circuit chip proximate to a frontside of said integrated circuit chip.

15. The method of claim 14, wherein opposite ends of said micro-channels are connected to first and second reservoirs in said supporting substrate proximate to said backside of said integrated circuit chip and said coolant is circulated from said first reservoir, through unblocked micro-channels to said second reservoir and back to said first reservoir, said fluid being cooled during said circulation.

16. A structure, comprising:
an integrated circuit chip having a frontside and a backside;
micro-channels formed in a supporting substrate proximate to a backside of said integrated circuit chip and functional circuits formed in a semiconductor layer of said integrated circuit chip proximate to a frontside of said integrated circuit chip, opposite ends of said micro-channels connected to first and second reservoirs in said supporting substrate proximate to said backside of said integrated circuit chip;
a coolant filling said micro-channels and said first and second reservoirs;
means for circulating said coolant from said first reservoir through said micro-channels to said second reservoir and from said second reservoir back to said first reservoir;
flow control means for (i) allowing said coolant to flow through micro-channels within regions of said integrated circuit chip only when temperatures of said regions exceed a first specified temperature and for (ii) blocking said coolant from flowing through micro-channels of regions of said integrated circuit chip when a temperature of said regions is below a second specified temperature; and
wherein said coolant is an electro-rheological fluid having a lower viscosity in the absence of an electric field and a higher viscosity in the presence of an electric field and wherein said flow control means includes a circuit configured to apply an electric field across said micro-channels in said regions to increase the viscosity of said coolant above a viscosity of said coolant in the absence of an electric field.

17. The structure of claim 16, wherein said flow control means includes a circuit configured to (i) not apply an electric field across said micro-channels in said regions or (ii) remove an electric field previously applied across said micro-channels in said regions so (iii) said coolant has a lower viscosity than a viscosity of said coolant in the presence of an electric field.

18. The structure of claim 16, further including:
temperature sensing circuits formed in said semiconductor layer of said integrated circuit chip proximate to said frontside of said integrated circuit chip, said temperature sensing circuits connected to said flow control means.

19. The structure of claim 16, wherein said means for circulating said coolant is a pump.

20. The structure of claim 16, further including:
means for cooling said coolant.

21. The structure of claim 20, wherein said micro-channels have a width between about 1 micron and about 10 microns and have a depth between about 1 micron and about 10 microns.

* * * * *